United States Patent
Alrod et al.

(10) Patent No.: US 9,595,353 B2
(45) Date of Patent: Mar. 14, 2017

(54) RESISTANCE-BASED MEMORY WITH AUXILIARY REDUNDANCY INFORMATION

(71) Applicant: SANDISK TECHNOLOGIES INC., Plano, TX (US)

(72) Inventors: Idan Alrod, Herzliya (IL); Eran Sharon, Rishon Lezion (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 65 days.

(21) Appl. No.: 14/620,753

(22) Filed: Feb. 12, 2015

(65) Prior Publication Data

US 2016/0240270 A1 Aug. 18, 2016

(51) Int. Cl.
| | |
|---|---|
| G11C 29/00 | (2006.01) |
| G11C 13/00 | (2006.01) |
| G06F 11/10 | (2006.01) |
| G11C 29/52 | (2006.01) |
| G11C 29/04 | (2006.01) |

(52) U.S. Cl.
CPC .......... G11C 29/70 (2013.01); G06F 11/1048 (2013.01); G11C 13/0002 (2013.01); G11C 29/52 (2013.01); G11C 2029/0411 (2013.01); G11C 2213/71 (2013.01)

(58) Field of Classification Search
None
See application file for complete search history.

(56) References Cited

U.S. PATENT DOCUMENTS

| | | | |
|---|---|---|---|
| 6,397,290 B1 | 5/2002 | Williams et al. | |
| 6,704,230 B1 * | 3/2004 | DeBrosse | G06F 11/106 365/158 |
| 8,437,183 B2 | 5/2013 | Sharon et al. | |
| 8,799,559 B2 | 8/2014 | Sharon et al. | |
| 2008/0094929 A1 * | 4/2008 | Rinerson | G11C 13/004 365/208 |
| 2011/0252288 A1 * | 10/2011 | Sharon | G06F 11/1048 714/758 |
| 2012/0173951 A1 * | 7/2012 | Kong | H03M 13/1515 714/755 |
| 2015/0363262 A1 * | 12/2015 | Hu | G06F 11/1044 714/773 |
| 2016/0093372 A1 * | 3/2016 | Fainzilber | G06F 11/1008 714/764 |

* cited by examiner

*Primary Examiner* — Daniel McMahon
(74) *Attorney, Agent, or Firm* — Toler Law Group, PC (57) ABSTRACT

A data storage device includes a resistance-based memory. A method includes storing a codeword into a first set of storage elements of the resistance-based memory. The codeword represents data to be stored, and the codeword includes first redundancy information associated with the data. The method further includes storing auxiliary redundancy information into a second set of storage elements of the resistance-based memory. The auxiliary redundancy information is associated with the data. The method further includes discarding the auxiliary redundancy information from the second set of storage elements while retaining the first redundancy information at the first set of storage elements.

26 Claims, 3 Drawing Sheets

RESISTANCE-BASED MEMORY WITH AUXILIARY REDUNDANCY INFORMATION

FIELD OF THE DISCLOSURE

This disclosure is generally related to data storage devices and more particularly to resistance-based memories.

BACKGROUND

Non-volatile storage devices have enabled increased portability of data and software applications. To illustrate, a resistance-based storage device may include resistance-based storage elements that can each be programmed to a high resistance state or to a low resistance state (e.g., to indicate a particular logic value). The state of a resistance-based storage element may be sensed by applying a voltage to the resistance-based storage element to generate a current at the resistance-based storage element. The magnitude of the current may indicate the state of the resistance-based storage element.

In some applications, a state of a resistance-based storage element may be temporarily unstable. As an example, after programming a resistance-based storage element to a particular state, resistance of the resistance-based storage element may increase or decrease due to instability associated with physical characteristics of the resistance-based storage element. In some cases, resistance of a resistance based storage element may fluctuate before "settling" at a value corresponding to a particular state. In this case, sensing the state of the resistance-based storage element may result in an "incorrect" sensed value. In some circumstances, a large number of such errors in sensed data may cause a decoding failure associated with the sensed data, which may result in data loss.

SUMMARY

A data storage device includes a resistance-based memory. In connection with a write operation to the resistance-based memory, the data storage device may encode data to generate a codeword that includes first redundancy information (e.g., a first set of parity bits) associated with the data. The data storage device may also generate auxiliary redundancy information (e.g., a second set of parity bits) associated with the data. The data storage device may write the codeword and the auxiliary redundancy information to the resistance-based memory, such as by writing the codeword to a first set of storage elements of the resistance-based memory and by writing the auxiliary redundancy information to a second set of storage elements of the resistance-based memory. After writing the codeword to the resistance-based memory, the data storage device may wait a particular time interval for states of the first set of storage elements to "settle."

After waiting the particular time interval, the data storage device may access the auxiliary redundancy information to correct one or more errors associated with the codeword. To illustrate, if the first redundancy information is insufficient to decode the codeword (e.g., due to one or more errors caused by instability of the first set of resistance-based storage elements), the data storage device may use the auxiliary redundancy information to "assist" in decoding the codeword. In an illustrative example, the data storage device may selectively adjust one or more of the first set of storage elements to compensate for resistive states being outside a target range due to instability associated with the resistance-based memory.

After adjusting one or more storage elements to compensate for instability, the data storage device may discard the auxiliary redundancy information (e.g., to free storage space for other information, such as user data). For example, the auxiliary redundancy information may be discarded according to a first-in, first-out (FIFO) basis as additional auxiliary redundancy information is programmed to the second set of storage elements in connection with other write operations. Thus, the auxiliary redundancy information may temporarily increase the capability of the data storage device to correct errors due to instability of resistance-based storage elements without utilizing a large amount of storage space at the resistance-based memory for long-term storage (e.g., because the auxiliary redundancy information may be discarded after correction of errors).

DETAILED DESCRIPTION

Figure 1:
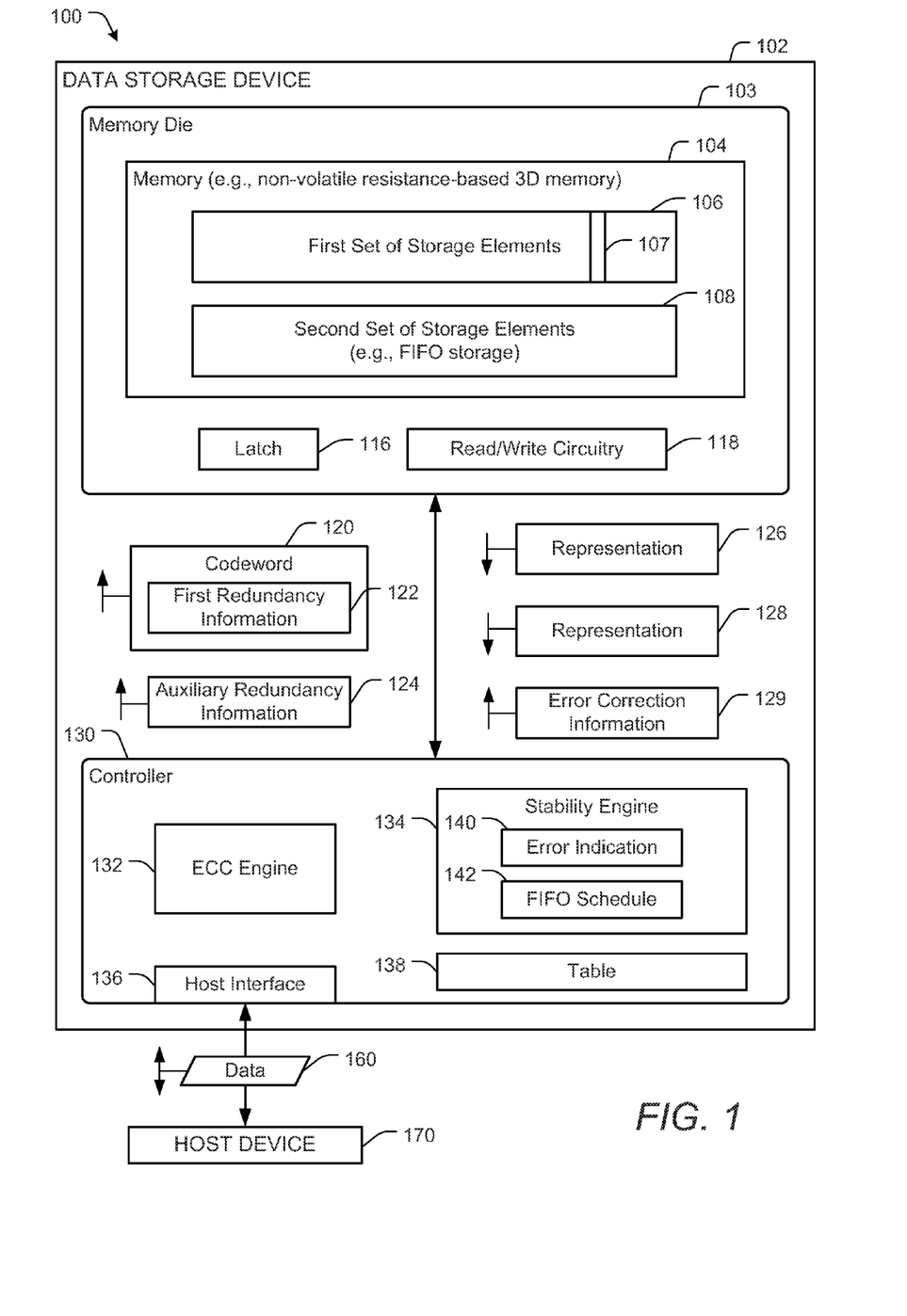
FIG. 1 is a block diagram of a particular illustrative embodiment of a system including a data storage device that includes a resistance-based memory configured to operate using auxiliary redundancy information.

Referring to FIG. 1, an illustrative example of a system is depicted and generally designated 100. The system 100 includes a data storage device 102 and an accessing device 170 (e.g., a host device).

The data storage device 102 and the accessing device 170 may be operationally coupled via a connection, such as a bus or a wireless connection. The data storage device 102 may be embedded within the accessing device 170, such as in accordance with a Joint Electron Devices Engineering Council (JEDEC) Solid State Technology Association Universal Flash Storage (UFS) configuration. Alternatively, the data storage device 102 may be removable from the accessing device 170 (i.e., "removably" coupled to the accessing device 170). As an example, the data storage device 102 may be removably coupled to the accessing device 170 in accordance with a removable universal serial bus (USB) configuration.

In some implementations, the data storage device 102 may include a solid state drive (SSD). The data storage device 102 may function as an embedded storage drive (e.g., an embedded SSD drive of a mobile device), an enterprise storage drive (ESD), a cloud storage device, a network-attached storage (NAS) device, or a client storage device, as illustrative, non-limiting examples. In some implementations, the data storage device 102 may be coupled to the accessing device 170 via a network. For example, the network may include a data center storage system network, an enterprise storage system network, a storage area network, a cloud storage network, a local area network (LAN), a wide area network (WAN), the Internet, and/or another network.

The data storage device 102 may include a memory die 103 and a controller 130. The memory die 103 and the controller 130 may be coupled via one or more buses, one or more interfaces, and/or another structure. An interface may be wired (e.g., a bus structure) or wireless (e.g., a wireless communication interface). Although FIG. 1 depicts a single memory die (the memory die 103) for convenience, it should be appreciated that the data storage device 102 may include another number of memory dies corresponding to the memory die 103 (e.g., two memory dies, eight memory dies, or another number of memory dies). Further, although FIG. 1 illustrates that the data storage device 102 includes the controller 130, in other implementations the memory die 103 may be directly coupled to the accessing device 170 (e.g., the accessing device 170 may include a controller or other device that accesses the memory die 103).

The memory die 103 includes a memory 104, such as a non-volatile memory and/or a resistance-based memory. An example of a resistance-based memory is a resistive random access memory (ReRAM). The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration that includes multiple memory dies).

The memory 104 may include multiple storage elements (also referred to herein as memory cells). Each storage element of the memory 104 may be a resistance-based storage element having a programmable resistance that can indicate a logic value (e.g., a bit or a symbol). For example, each storage element of the memory 104 may be configured to be set to either a high resistance state or to a low resistance state. The high resistance state may correspond to a logic "0" bit, and the low resistance state may correspond to a logic "1" bit (or vice versa). Storage elements of the memory 104 may be grouped into storage regions, such as rows, columns, word lines, and/or blocks, as illustrative examples. To illustrate, the memory 104 may include a first storage region (e.g., a first set of storage elements 106) and a second storage region (e.g., a second set of storage elements 108).

In some implementations, the second set of storage elements 108 may include or may function as a first-in, first-out (FIFO) storage device. To illustrate, the second set of storage elements 108 may include a dedicated storage region (e.g., a FIFO buffer or cache) that is distinct from the first set of storage elements 106. In another example, the structure of the second set of storage elements 108 may be as described with reference to the first set of storage elements 106 (e.g., the sets of storage elements 106, 108 may both be integrated within a common memory array), and the second set of storage elements 108 may function as a FIFO storage device.

The memory die 103 may further include one or more latches (e.g., one or more data latches and/or one or more control latches). For example, the memory die 103 may include a latch 116. The latch 116 may be a data latch that is configured to receive information from the controller 130 for write operations to the memory 104. FIG. 1 also illustrates that the memory die 103 may include read/write circuitry 118. The read/write circuitry 118 may be coupled to the latch 116. The latch 116 and the read/write circuitry 118 may be associated with operation of storage elements of the memory 104 (e.g., read and write operations to storage elements of the memory 104).

The controller 130 may include an error correcting code (ECC) engine 132, a stability engine 134, and an interface to enable access by the accessing device 170, such as a host interface 136. The controller 130 may be coupled to the accessing device 170 via the host interface 136. The controller 130 may store a table 138 (e.g., a physical memory usage mapping table).

The controller 130 is configured to receive data and instructions from the accessing device 170 and to send data to the accessing device 170. For example, the controller 130 may receive data 160 from the accessing device 170 via the host interface 136 and may send data 160 to the accessing device 170 via the host interface 136.

The controller 130 is configured to send data and commands to the memory 104 and to receive data from the memory 104. For example, the controller 130 is configured to send data and a write command to cause the memory 104 to store the data to a specified address of the memory 104. The write command may specify a physical address of a portion of the memory 104 that is to store the data. The controller 130 is configured to send a read command to the memory 104 to access data from a specified address of the memory 104. The read command may specify the physical address of a portion of the memory 104.

The ECC engine 132 may be configured to receive data and to generate one or more ECC codewords based on the data. The ECC engine 132 may include a Hamming encoder, a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC schemes, or a combination thereof. The ECC engine 132 may be configured to decode data accessed from the memory 104. For example, the ECC engine 132 may be configured to decode data accessed from the memory 104 to detect and correct one or more errors that may be present in the data, up to an error correction capacity of the particular ECC scheme. The ECC engine 132 may include a Hamming decoder, an RS decoder, a BCH decoder, an LDPC decoder, a turbo decoder, a decoder configured to decode data according to one or more other ECC schemes, or a combination thereof.

The accessing device 170 may correspond to a mobile telephone, a computer (e.g., a laptop, a tablet, or a notebook computer), a music player, a video player, a gaming device or console, an electronic book reader, a personal digital assistant (PDA), a portable navigation device, another electronic device, or a combination thereof. The accessing device 170 may communicate via a host controller, which may enable the accessing device 170 to communicate with the data storage device 102. The accessing device 170 may operate in compliance with a JEDEC Solid State Technology Association industry specification, such as an embedded MultiMedia Card (eMMC) specification or a Universal Flash Storage (UFS) Host Controller Interface specification. The accessing device 170 may operate in compliance with one or more other specifications, such as a Secure Digital (SD) Host Controller specification as an illustrative example. Alternatively, the accessing device 170 may communicate with the data storage device 102 in accordance with another communication protocol. In some implementations, the system 100, the data storage device 102, or the memory 104 may be integrated within a network-accessible data storage system, such as an enterprise data system, an NAS system, or a cloud data storage system, as illustrative examples.

During operation, the controller 130 may receive data 160 from the accessing device 170. For example, the controller 130 may receive the data 160 and a request for write access to the memory 104 from the accessing device 170 via the host interface 136.

The controller 130 may input the data 160 to the ECC engine 132. The ECC engine 132 may encode the data 160 to generate one or more codewords, such as a codeword 120. To illustrate, the ECC engine 132 may encode the data 160 using a first encoding technique. The first encoding technique may be a systematic encoding technique (in which case the codeword 120 includes a sequence of bits or symbols corresponding to the data 160) or a non-systematic encoding technique (in which case the codeword 120 does not include a sequence of bits (or symbols) corresponding to the data 160). In either case, the codeword 120 includes first redundancy information 122 (e.g., first ECC information, such as first parity bits) generated based on the data 160, and the codeword 120 represents (e.g., can be decoded to produce) the data 160.

As additional, non-limiting examples, the codeword 120 may be an LDPC codeword, and the first redundancy information 122 may include parity check bits. In other examples, the codeword 120 may be a BCH codeword, a convolutional codeword, a turbo codeword, a Hamming codeword, an RS codeword, or another codeword. Because the codeword 120 includes the first redundancy information 122, the codeword 120 may include a greater number of bits (or symbols) than the data 160.

The ECC engine 132 is further configured to generate auxiliary redundancy information 124 (e.g., auxiliary ECC information, such as auxiliary parity bits) based on the data 160. The auxiliary redundancy information 124 may be generated using an auxiliary encoding technique. Depending on the particular implementation, the auxiliary encoding technique may correspond to the first encoding technique, or the second encoding technique may be different than the first encoding technique.

To illustrate, in some applications, the ECC engine 132 may re-encode the codeword 120 using the first encoding technique. In this example, the auxiliary encoding technique corresponds to the first encoding technique (e.g., a concatenated code), and the codeword 120 and the auxiliary redundancy information 124 may form a concatenated codeword.

In another illustrative implementation, the ECC engine 132 is configured to generate the auxiliary redundancy information 124 by selecting particular bits (or symbols) of the first redundancy information 122 according to a selection scheme. As an example, the selection scheme may specify that each ith bit (or symbol) of the first redundancy information 122 is to be selected, where i is a positive integer. The selected bits (or symbols) may correspond to the auxiliary redundancy information 124, or the selected bits (or symbols) may be re-encoded by the ECC engine 132 to generate the auxiliary redundancy information 124.

In another example, the first redundancy information 122 and the auxiliary redundancy information 124 may be generated by the ECC engine 132 using a single encoding operation. For example, upon receiving the data 160, the ECC engine 132 may encode the data 160 to generate a set of redundancy information, and the controller 130 may select a subset of the redundancy information to produce the first redundancy information 122. In this example, the auxiliary redundancy information 124 may include either the "full" set of redundancy information or the "remainder" of the set of redundancy information (the set of redundancy information without the first redundancy information 122).

In another implementation, the auxiliary redundancy information 124 may be generated using an auxiliary encoding technique that is different than a first encoding technique used to generate the first redundancy information 122. As an example, the first redundancy information 122 may be generated by encoding the data 160 using a "short" code (e.g., a code associated with a higher code rate), and the auxiliary redundancy information 124 may be generated by encoding the data 160 using a "long" code (e.g., a code associated with a lower code rate). In this case, the first redundancy information 122 may include fewer bits (or symbols) than the auxiliary redundancy information 124.

To further illustrate, the first redundancy information 122 may be generated by encoding the data 160 using a BCH encoding technique, and the auxiliary redundancy information 124 may be generated by encoding the data 160 using an LDPC encoding technique. In this case, the auxiliary redundancy information 124 may include an LDPC codeword. Alternatively or in addition, the auxiliary redundancy information 124 may include a BCH codeword, a convolutional codeword, a turbo codeword, a Hamming codeword, an RS codeword, or another codeword.

In some cases, the controller 130 may generate the auxiliary redundancy information 124 by copying the first redundancy information 122. In this case, the auxiliary redundancy information 124 is a copy of (e.g., may be identical to) the first redundancy information 122 (e.g., to enable correction of errors of the first redundancy information 122).

Depending on the particular implementation, the ECC engine 132 may include a single encoder or multiple encoders. In a particular illustrative single encoder implementation, an output of an encoder of the ECC engine 132 may be connected to an input of the encoder of the ECC engine 132 (e.g., via a switchable path). In this example, the first redundancy information 122 (or a portion thereof) may be provided from the output of the encoder of the ECC engine 132 to the input of the encoder of the ECC engine 132 (e.g., via the switchable path) to generate the auxiliary redundancy information 124.

In a particular illustrative multiple encoder scheme, a first input of a first encoder of the ECC engine 132 and a second input of a second encoder of the ECC engine 132 are each coupled to receive the data 160. In this example, the first encoder of the ECC engine 132 may encode the data 160 to generate the first redundancy information 122, and the second encoder of the ECC engine 132 may encode the data 160 to generate the auxiliary redundancy information 124. In a particular illustrative example, the first encoder may encode the data 160 in parallel with the second encoder. In other implementations, the first encoder may operate serially with respect to the second encoder.

Although the codeword 120 and the auxiliary redundancy information 124 are described separately for convenience, it should be appreciated that in some cases the codeword 120 and the auxiliary redundancy information 124 may form a single codeword. As an illustrative example, the codeword 120 and the auxiliary redundancy information 124 may form a single codeword that can be decoded by the ECC engine 132 using a single decoding process. In other implementations, the codeword 120 and the auxiliary redundancy information 124 may be decodable by the ECC engine 132 using multiple decoding processes.

The controller 130 may cause the codeword 120 and the auxiliary redundancy information 124 to be stored at the memory 104. For example, the controller 130 may send the codeword 120 and the auxiliary redundancy information 124 to the memory die 103, and the memory die 103 may receive the codeword 120 and the auxiliary redundancy information 124 at one or more latches of the memory die 103, such as at the latch 116. Depending on the particular application, the controller 130 may be configured to send the first redundancy information 122 and the auxiliary redundancy information 124 to the memory die 103 in parallel or serially (e.g., if a data size of the codeword 120 and the auxiliary redundancy information 124 exceeds a storage size of the latch 116).

In response to receiving the codeword 120 and the auxiliary redundancy information 124, the memory die 103 may store the codeword 120 and the auxiliary redundancy information 124 at the memory 104. For example, the memory die 103 may cause the read/write circuitry 118 to access the latch 116 and to apply programming signals to the memory 104 to program the codeword 120 and the auxiliary redundancy information 124 to the memory 104. Depending on the particular application, the memory die 103 may be configured to store the first redundancy information 122 in parallel with storing the auxiliary redundancy information 124 to the memory 104 or sequentially (e.g., using serial storage operations to store the first redundancy information 122 and the auxiliary redundancy information 124).

In some implementations, the memory die 103 may be configured to generate the auxiliary redundancy information 124 (instead of the controller 130 generating the auxiliary redundancy information 124). To illustrate, in some cases, the memory die 103 may be configured to access the first redundancy information 122 from the latch 116 to generate the auxiliary redundancy information 124, such as by copying the first redundancy information 122 or by selecting particular bits of the first redundancy information 122, as illustrative examples. In these examples, the memory die 103 may include circuitry configured to perform operations (e.g., a copy operation or a bit selection operation) using the first redundancy information 122 to generate the auxiliary redundancy information 124.

The memory die 103 is configured to store the codeword 120 to the first set of storage elements 106 and to store the auxiliary redundancy information 124 to the second set of storage elements 108. In some implementations, the sets of storage elements 106, 108 are included in a common storage region of the memory 104. For example, the sets of storage elements 106, 108 may be included in a common word line of the memory 104. As another example, the sets of storage elements 106, 108 may be included in a common block of the memory 104, such as if a first word line of the particular block includes the first set of storage elements 106 and if a second word line of the particular block includes the second set of storage elements 108. In other implementations, the sets of storage elements 106, 108 may correspond to separate storage regions of the memory 104 (e.g., separate blocks of the memory 104). As an illustrative example, the second set of storage elements 108 may be included in a reserved storage region that is dedicated to storing sets of auxiliary parity bits.

In response to storing the codeword 120 at the first set of storage elements 106, the controller 130 may wait a particular time interval (e.g., a wait time) after storing the codeword into the first set of storage elements 106 before accessing the first set of storage elements 106. For example, the particular time interval may be selected to enable states of the first set of storage elements to "relax" or "settle." In this example, the particular time interval has a duration corresponding to a "relaxation effect" associated with states of the memory 104. To further illustrate, the stability engine 134 may include a timer, and the stability engine 134 may be configured to reset the timer in response to storing the codeword 120 at the first set of storage elements 106. The stability engine 134 may store data indicating the duration of the particular time interval.

The stability engine 134 may initiate a correction process associated with the first set of storage elements 106. For example, after waiting the particular time interval (e.g., when the timer indicates expiration of the particular time interval), the stability engine 134 may initiate the correction process. The stability engine 134 may perform the correction process to determine whether the first group of storage elements 106 is associated with one or more errors caused by instability associated with resistance-based storage elements, such as instability that may cause a state (e.g., resistance) of a resistance-based storage element to "drift" before "settling" at a particular state.

Depending on the particular implementation, the correction process may include "automatically" accessing both the first set of storage elements 106 and the second set of storage elements 108. In other implementations, the second set of storage elements 108 may be accessed in response to a determination by the stability engine 134 that the auxiliary redundancy information 124 is to be used for a decoding operation by the ECC engine 132 (e.g., on an "as needed" basis).

The correction process may include sending a read command from the controller 130 to the memory die 103 to access the first set of storage elements 106. In this example, the memory die 103 may cause the read/write circuitry 118 to access the first set of storage elements 106, such as by sensing the first set of storage elements 106 to generate a representation 126 of the codeword 120. The representation 126 of the codeword 120 may differ from the codeword 120 due to one or more bit errors.

The controller 130 may input the representation 126 of the codeword 120 to the ECC engine 132 for a first decoding process. The ECC engine 132 may generate an error indication 140 based on the first decoding process, and the ECC engine 132 may provide the error indication 140 to the stability engine 134. If the ECC engine 132 successfully decodes the representation 126, the error indication 140 may specify a number of errors detected during the first decoding process and/or a location (e.g., bit position) of one or more errors detected during the first decoding process. If the ECC engine 132 fails to decode the representation 126 (e.g., due to a number of errors of the representation 126 exceeding an error correcting capability of the ECC engine 132), the error indication 140 may specify failure of the first decoding process.

If the error indication 140 specifies that no errors were detected in the representation 126 of the codeword 120 by the ECC engine 132, then the stability engine 134 may terminate the correction process. In some implementations, the stability engine 134 is configured to cause the auxiliary redundancy information 124 to be discarded from the memory 104 in response to the error indication 140 specifying that the ECC engine 132 fails to detect any errors associated with the representation 126. For example, the controller 130 may issue an erase command to the memory die 103 to cause the memory die 103 to discard (e.g., erase) the auxiliary redundancy information 124 from the memory 104. In another example, "discarding" the auxiliary redundancy information 124 may instead including designating storage elements of the memory 104 (e.g., the second group of storage elements 108) as being available to store data without erasing the auxiliary redundancy information 124. To further illustrate, a storage element of the second group of storage elements 108 may store a "valid bit" indicating whether the second group of storage elements 108 stores valid data or is available for reuse (e.g., a write operation, such as a write operation that "overwrites" the auxiliary redundancy information 124). In this case, discarding the auxiliary redundancy information 124 may include adjusting a value of a valid bit (or another indication) to indicate that the second group of storage elements 108 is available for reuse.

If the error indication 140 specifies one or more errors associated with the representation 126, the stability engine 134 may send error correction information 129 to the memory 104 to correct one or more errors at the first set of storage elements 106. For example, the error correction information 129 may identify one or more storage elements of the first set of storage elements 106 storing "incorrect" values, and the error correction information 129 may cause the memory die 103 to re-program the one or more storage elements based on the error correction information 129 (e.g., using an "in-place" ReRAM programming operation in which "incorrect" values are overwritten with "correct" values).

If the error indication 140 specifies that the first decoding process fails to successfully decode the representation 126, the stability engine 134 may initiate an auxiliary decoding operation using a representation 128 of the auxiliary redundancy information 124 generated by sensing the second set of storage elements 108. In some cases, the representation 128 may be generated "automatically" in connection with generating the representation 126 (e.g., the representations 126, 128 may be provided from the memory die 103 to the controller 130 in parallel). In this example, the controller 130 may retrieve the representation 128 from a memory of the controller 130, such as a random access memory (RAM). In other cases, the representation 128 may be generated on an "as needed" basis (e.g., in response to the error indication 140 specifying failure of the first decoding process). In these examples, the controller 130 may issue a read command to the memory die 103 to cause the memory die 103 to sense the second set of storage elements 108 to generate the representation 128.

The controller 130 may be configured to input the representation 128 to the ECC engine 132. The representation 128 may enable the ECC engine 132 to decode the representation 126. In this case, the ECC engine 132 may provide a second error indication to the stability engine 134. The second error indication may specify a number of errors and/or a location (e.g., bit position) of one or more errors of the representation 126. In this example, the error correction information 129 may be generated based on the second error indication.

In some implementations, the stability engine 134 is configured to perform a verification process in response to sending the error correction information 129 to the memory die 103. For example, after sending the error correction information 129, the stability engine 134 may initiate another sense operation of the first set of storage elements 106 to generate another representation of the codeword 120 to verify stability of the states of the first set of storage elements 106 (e.g., to verify that states of the first set of storage elements 106 have "settled" after re-programming of the one or more storage elements). In some implementations, the stability engine 134 is configured to initiate one or more additional correction processes until a verification process indicates that states at the first set of storage elements 106 are stable and store an error-free representation of the codeword 120.

In some implementations, the stability engine 134 is configured to cause the auxiliary redundancy information 124 to be discarded from the memory 104 in response to determining (e.g., using the verification process) that states of the first set of storage elements 106 are stable. For example, the controller 130 may issue an erase command to the memory die 103 to cause the memory die 103 to discard (e.g., erase or indicate as unused or storing invalid data) the auxiliary redundancy information 124 to be discarded from the memory 104. Thus, the stability engine 134 may be configured to initiate re-programming (e.g., by generating the error correction information 129) of a subset (e.g., an illustrative subset 107) of the first set of storage elements 106 to decrease short-term instability associated with states programmed to the subset and/or to decrease sensitivity of the subset to noise. The stability engine 134 may be further configured to cause the auxiliary redundancy information 124 to be discarded in response to re-programming of the subset of the first set of storage elements 106 (e.g., to increase available storage of the memory 104).

After the auxiliary redundancy information 124 is discarded from the memory 104, the second set of storage elements 108 may be used to store other information. For example, in some cases, the second set of storage elements 108 may store user data. In other cases, the second set of storage elements may store one or more other sets of auxiliary redundancy information associated with user data.

In some implementations, the controller 130 may be configured to update the table 138 to indicate that the codeword 120 is associated with the auxiliary redundancy information 124. For example, the controller 130 may be configured to set an entry (e.g., a bit) of the table 138 to a first value (e.g., a logic "1" value) to indicate that codeword 120 is associated with the auxiliary redundancy information 124. The controller 130 may be further configured to set the entry of the table to a second value (e.g., a logic "0" value) in response to discarding the auxiliary redundancy information 124. The table 138 may identify physical addresses associated with the first set of storage elements 106 and the second set of storage elements 108. In this example, the table 138 may include a physical memory usage mapping table that indicates usage of the memory 104, such as by indicating which regions of the memory 104 and/or which data stored at the memory 104 are associated with corresponding sets of auxiliary redundancy information.

In an illustrative implementation, the second set of storage elements 108 is configured to function as a FIFO storage device. For example, information programmed to the second set of storage elements 108 may be deleted (e.g., "evicted" or overwritten) by the stability engine 134 according to a FIFO basis, such as by replacing information stored at the second set of storage elements 108 with other information on a FIFO basis. In some cases, the stability engine 134 may store information (e.g., a FIFO schedule 142) indicating a programming order of auxiliary redundancy information written to the second set of storage elements 108. In this example, the stability engine 134 may access the FIFO schedule 142 to determine which (if any) auxiliary parity information to evict or overwrite from the second set of storage elements 108 in connection with write operations to the memory 104.

As an illustrative example, prior to programming the auxiliary redundancy information 124 to the second set of storage elements 108, the stability engine 134 may access the FIFO schedule 142 to determine whether to evict or overwrite information from the second set of storage elements 108 (e.g., to determine whether the second set of storage elements 108 is "full"). If an available storage space of the second set of storage elements 108 is less than a data size of the auxiliary redundancy information 124, the stability engine 134 may cause the memory die 103 to evict or overwrite (using the auxiliary redundancy information 124) information stored at the second set of storage elements 108, such as by evicting or overwriting the "oldest" information stored at the second set of storage elements 108. As another example, if the auxiliary redundancy information 124 is the "oldest" information (i.e., was programmed before other information) stored at the second set of storage elements 108, subsequent auxiliary information to be stored at the second set of storage elements 108 may "push" the auxiliary redundancy information 124 out of the second set of storage elements 108, may overwrite the auxiliary redundancy information 124, or a combination thereof.

In some implementations, the second set of storage elements 108 includes a FIFO storage device having a storage size that corresponds to one or more of a programming throughput to be achieved at the data storage device 102 or the duration of the particular time interval. To illustrate, the storage size of the FIFO storage device may be selected based on the product of the programming throughput and the duration of the particular time interval. Thus, the storage size of the FIFO storage device may be selected to enable a particular throughput at the data storage device 102 while also facilitating a "wait time" (the particular time interval) so that states can "settle" prior to initiating a correction process.

The example of FIG. 1 illustrates that the data storage device 102 may use the auxiliary redundancy information 124 to correct one or more errors caused by instability associated with storage elements of the memory 104 after programming the codeword 120. For example, the auxiliary redundancy information 124 may correspond to "strong" ECC information having a large error correcting capability. Thus, use of the auxiliary redundancy information 124 may prevent or reduce instances of data loss due to instability at the memory 104. After correcting one or more errors at the first set of storage elements 106, the auxiliary redundancy information 124 may be discarded from the memory 104 (e.g., to free storage space for other information).

Figure 2:
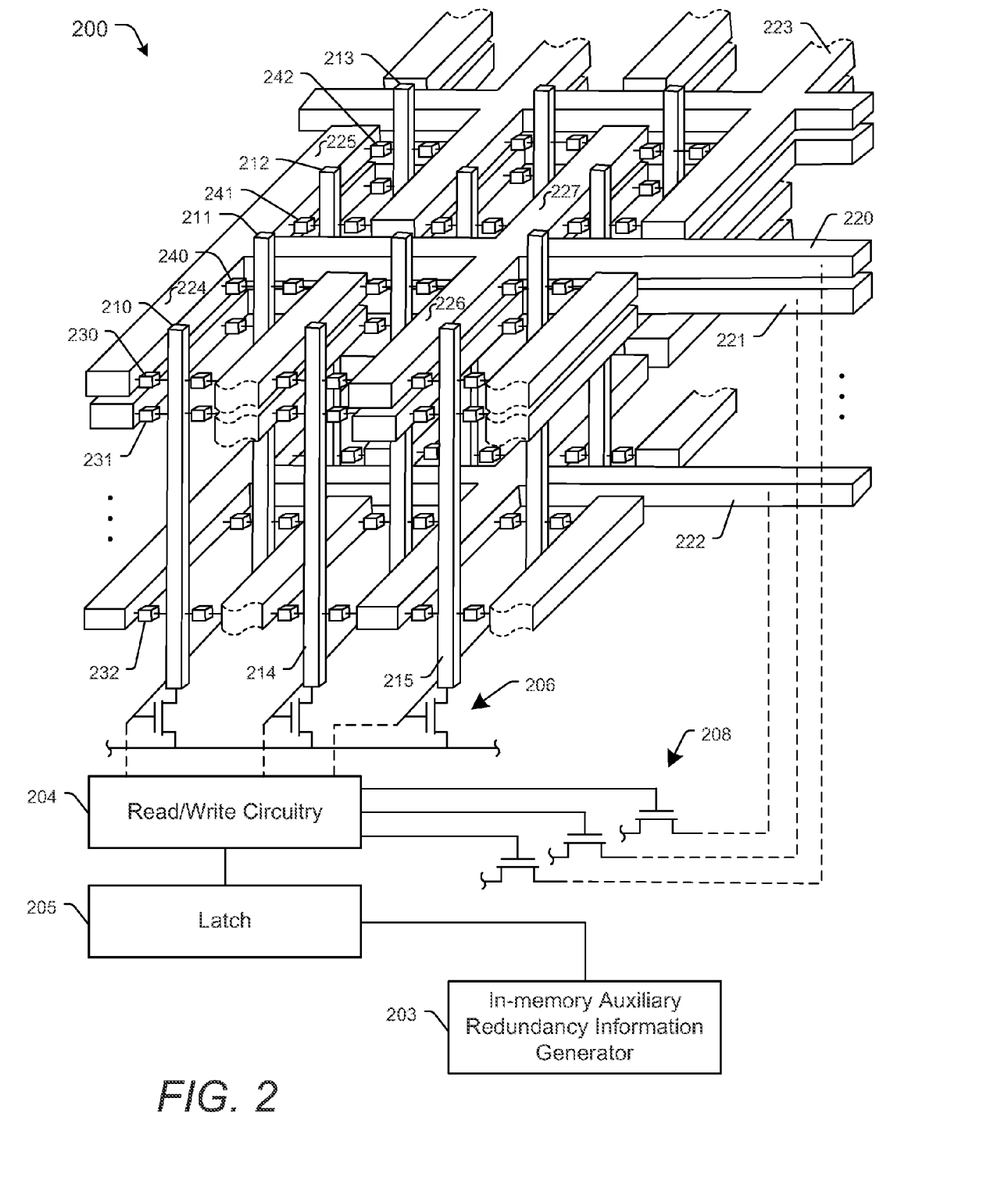
FIG. 2 is a diagram of an illustrative embodiment of a portion of a memory die that may be included in the data storage device of FIG. 1.

FIG. 2 illustrates a portion of a memory die 200 having a resistance-based memory configuration, such as a resistive random access memory (ReRAM) configuration. The memory die 200 may be included in the data storage device 102 of FIG. 1. For example, the memory die 200 may correspond to the memory die 103 of FIG. 1. The memory die 200 may be coupled to the controller 130 of FIG. 1.

The memory die 200 may include read/write circuitry 204 and one or more latches (e.g., a latch 205). For example, the read/write circuitry 204 may correspond to the read/write circuitry 118 of FIG. 1, and the latch 205 may correspond to the latch 116 of FIG. 1. The memory die 200 may also include an in-memory auxiliary redundancy information generator 203.

In the example of FIG. 2, the memory die 200 includes a vertical bit line (VBL) ReRAM with a plurality of conductive lines in physical layers over a substrate (e.g., substantially parallel to a surface of the substrate), such as representative word lines 220, 221, 222, and 223 (only a portion of which is shown in FIG. 2). The VBL ReRAM also includes a plurality of vertical conductive lines through the physical layers, such as representative bit lines 210, 211, 212, and 213. The word line 222 may include or correspond to a first group of physical layers, and the word lines 220, 221 may include or correspond to a second group of physical layers.

The memory die 200 also includes a plurality of resistance-based storage elements (e.g., memory cells), such as representative storage elements 230, 231, 232, 240, 241, and 242. Each of the storage elements 230, 231, 232, 240, 241, and 242 is coupled to (or is associated with) a bit line and a word line in arrays of memory cells in multiple physical layers over the substrate (e.g., a silicon substrate).

In the example of FIG. 2, each word line includes a plurality of fingers. To illustrate, the word line 220 includes fingers 224, 225, 226, and 227. Each finger may be coupled to more than one bit line. For example, the finger 224 of the word line 220 is coupled to the bit line 210 via the storage element 230 at a first end of the finger 224, and the finger 224 is further coupled to the bit line 211 via the storage element 240 at a second end of the finger 224.

In the example of FIG. 2, each bit line may be coupled to more than one word line. To illustrate, the bit line 210 is coupled to the word line 220 via the storage element 230, and the bit line 210 is further coupled to the word line 222 via the storage element 232.

During a write operation, the controller 130 of FIG. 1 may receive data (e.g., the data 160 of FIG. 1), such as from the accessing device 170 of FIG. 1. The controller 130 may send a command to the memory die 200 to cause the memory die 200 to initiate the write operation. The controller 130 may send information (e.g., the codeword 120) to the memory die 200 to be written to storage elements of the memory die 200. For example, the controller 130 may latch the codeword 120 into the latch 205.

In the example of FIG. 2, the in-memory auxiliary redundancy information generator 203 may access at least a portion of the codeword 120 at the latch 205 to generate the auxiliary redundancy information 124 of FIG. 1. For example, in some implementations, the in-memory auxiliary redundancy information generator 203 may be configured to copy the first redundancy information 122 to generate the auxiliary redundancy information 124. In other implementations, the in-memory auxiliary redundancy information generator 203 may include an encoder configured to encode the codeword 120 to generate the auxiliary redundancy information 124 (e.g., a concatenated codeword). Alternatively or in addition, the in-memory auxiliary redundancy information generator 203 may be configured to perform one or more other operations. The in-memory auxiliary redundancy information generator 203 may be configured to store the auxiliary redundancy information 124 in a buffer, cache, or other region of the memory die 200 accessible to the read/write circuitry 204.

The read/write circuitry 204 may be configured to access the codeword 120 in the latch 205 and the auxiliary redundancy information 124 and to program storage elements corresponding to the destination of the codeword 120 and the auxiliary redundancy information 124. For example, the read/write circuitry 204 may apply selection signals to selection control lines coupled to the word line drivers 208 and the bit line drivers 206 to cause a write voltage to be applied across a selected storage element. As an illustrative example, to select the storage element 230, the read/write circuitry 204 may activate the word line drivers 208 and the bit line drivers 206 to drive a programming current (also referred to as a write current) through the storage element 230. To illustrate, a first write current may be used to write a first logical value (e.g., a value corresponding to a high-resistance state) to the storage element 230, and a second write current may be used to write a second logical value (e.g., a value corresponding to a low-resistance state) to the storage element 230. The programming current may be applied by generating a programming voltage across the storage element 230 by applying a first voltage to the bit line 210 and to word lines other than the word line 220 and by applying a second voltage to the word line 220. In a particular embodiment, the first voltage is applied to other bit lines (e.g., the bit lines 214, 215) to reduce leakage current in the memory die 200.

During a read operation, the controller 130 may receive a request, such as from the accessing device 170 of FIG. 1. The controller 130 may issue a command to the memory die 200 specifying one or more physical addresses of the memory die 200.

The memory die 200 may cause the read/write circuitry 204 to read bits from particular storage elements of the memory die 200, such as by applying selection signals to selection control lines coupled to the word line drivers 208 and the bit line drivers 206 to cause a read voltage to be applied across a selected storage element. For example, to select the storage element 230, the read/write circuitry 204 may activate the word line drivers 208 and the bit line drivers 206 to apply a first voltage (e.g., 0.7 volts (V)) to the bit line 210 and to word lines other than the word line 220. A lower voltage (e.g., 0 V) may be applied to the word line 220. Thus, a read voltage is applied across the storage element 230, and a read current corresponding to the read voltage may be detected at a sense amplifier of the read/write circuitry 204. The read current corresponds (via Ohm's law) to a resistance state of the storage element 230, which corresponds to a logic value stored at the storage element 230. The logic value read from the storage element 230 and other elements read during the read operation may be provided to the controller 130 of FIG. 1 (e.g., via the latch 205). The logic values may correspond to the codeword 120 and/or the auxiliary redundancy information 124.

Figure 3:
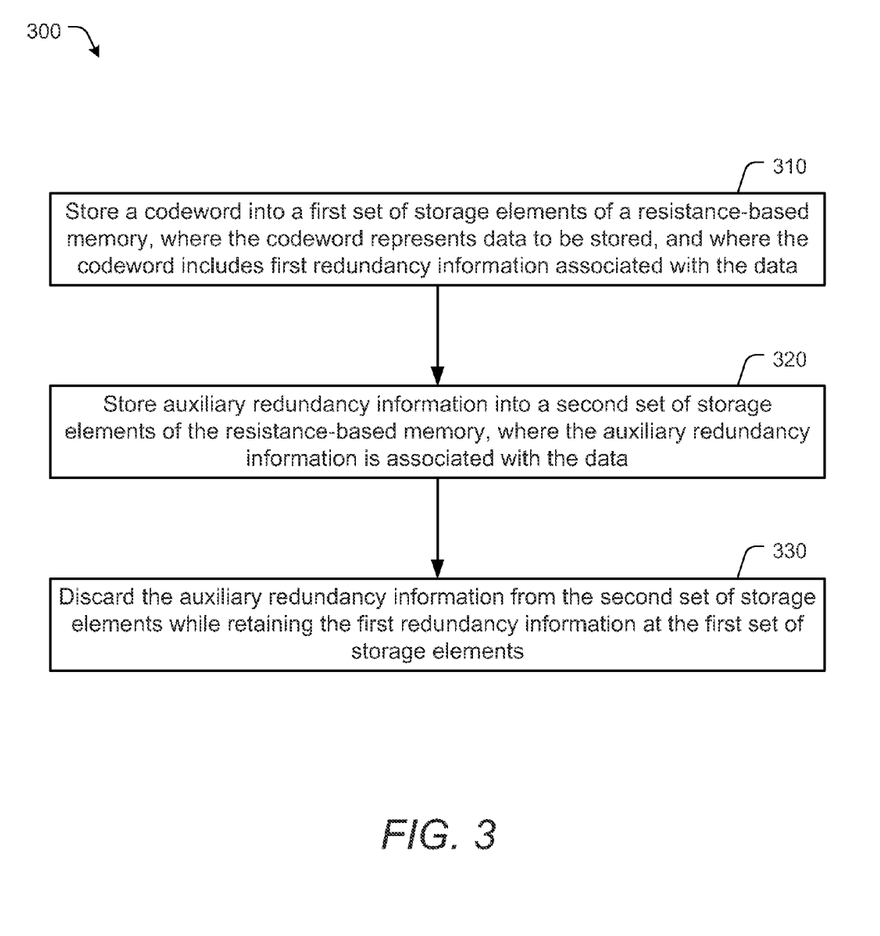
FIG. 3 is a flow diagram of an illustrative embodiment of a method of operation of the data storage device of FIG. 1.

Referring to FIG. 3, an illustrative example of a method is depicted and generally designated 300. The method 300 may be performed in a data storage device (e.g., the data storage device 102) that includes a resistance-based memory (e.g., the memory 104). In a particular embodiment, operations of the method 300 are initiated by the controller 130.

The method 300 includes storing a codeword into a first set of storage elements of the resistance-based memory, at 310. The codeword represents data to be stored, and the codeword includes first redundancy information associated with the data. To illustrate, the codeword may correspond to the codeword 120, and the first set of storage elements may correspond to the first set of storage elements 106 and/or a storage region described with reference to FIG. 2, such as one of the word lines 220, 221, 222, and 223. The codeword 120 represents the data 160, and the codeword 120 includes the first redundancy information 122.

The method 300 further includes storing auxiliary redundancy information into a second set of storage elements of the resistance-based memory, at 320. For example, the auxiliary redundancy information may correspond to the auxiliary redundancy information 124, and the second set of storage elements may correspond to the second set of storage elements 108 and/or a storage region described with reference to FIG. 2, such as another of the word lines 220, 221, 222, and 223. The auxiliary redundancy information 124 is associated with (e.g., generated based on) the data 160.

The method 300 further includes discarding (e.g., erasing, invalidating, evicting, and/or overwriting) the auxiliary redundancy information from the second set of storage elements while retaining the first redundancy information at the first set of storage elements, at 330. For example, the controller 130 may issue an erase command to the memory die 103 to cause the memory die 103 to discard the auxiliary redundancy information 124 from the second set of storage elements 108 without discarding the codeword 120 from the first group of storage elements 106. As another example, the controller 130 may designate that the second set of storage elements 108 is unused and/or that the auxiliary redundancy information 124 is invalid, such as by adjusting a value of a valid bit stored at a particular storage element of the second set of storage elements 108. As an additional example, the controller 130 may evict or overwrite the auxiliary redundancy information based on a first-in, first-out (FIFO) schedule, such as the FIFO schedule 142 of FIG. 1.

In some cases, the auxiliary redundancy information 124 may be discarded if the codeword 120 is stored "correctly" at the memory 104 (e.g., if instability of storage elements of the first set of storage elements 106 does not cause one or more errors). In this example, the method 300 may include reading a representation (e.g., the representation 126) of the codeword from the first set of storage elements (e.g., after waiting the particular time interval described with reference to FIG. 1), and the auxiliary redundancy information may be discarded from the second set of storage elements in response to decoding the representation of the codeword using the first redundancy information (e.g., if the error indication 140 specifies that that representation 126 does not include one or more errors).

In other cases, the auxiliary redundancy information may be discarded after correcting one or more errors at the first set of storage elements. For example, the auxiliary redundancy information 124 may be discarded in response to re-programming a subset of the first set of storage elements 106 based on the error correcting information 129. In this example, the method 300 may include sending, in response to an ECC operation indicating that the representation 126 of the codeword 120 includes one or more errors, error correction information to the resistance-based memory. For example, the ECC operation may include a decoding process performed by the ECC engine 132, and the error correction information may correspond to the error correction information 129. The method 300 may include re-programming a subset of the first set of storage elements 106 based on the error correction information 129, and the auxiliary redundancy information 124 may be discarded in response to re-programming the subset of the first set of storage elements 106.

In some implementations, the method 300 includes reading a representation (e.g., the representation 126) of the codeword from the first set of storage elements 106 (e.g., after waiting the particular time interval described with reference to FIG. 1) and reading a representation (e.g., the representation 128) of the auxiliary redundancy information from the second set of storage elements 108, such as by "automatically" accessing the second set of storage elements 108 in response to accessing the first set of storage elements 106. In this example, the ECC operation may be performed using the representation 126 and the representation 128. In other implementations, the representation 128 is read on an "as needed" basis. In this example, the ECC operation may be performed using the representation 126, and the representation 128 may be read in response to the ECC operation using the representation 126 being unable to decode the representation 126.

The method 300 may include setting an entry (e.g., a bit) of a table (e.g., the table 138) to a first value to indicate that the codeword is associated with the auxiliary redundancy information. The method 300 may further include setting, in response to discarding the auxiliary redundancy information, the entry of the table to a second value (e.g., to indicate that the auxiliary redundancy information has been discarded).

The data storage device described with reference to FIG. 3 may further include a controller (e.g., the controller 130) that is coupled to the resistance-based memory. In a particular example, storing the codeword 120, storing the auxiliary redundancy information 124, and discarding the auxiliary redundancy information 124 are initiated by the controller 130.

The method 300 of FIG. 3 may temporarily increase capability to correct errors due to instability of resistance-based storage elements. For example, the auxiliary redundancy information 124 may be used to correct one or more errors due instability of resistance-based storage elements. The auxiliary redundancy information 124 may be discarded after correcting the one or more errors (e.g., to increase available storage capacity). In a particular example, operations of the method 300 are controlled or initiated by the stability engine 134 of FIG. 1.

Although the stability engine 134 and certain other components described herein are illustrated as block components and described in general terms, such components may include one or more microprocessors, state machines, and/or other circuits configured to enable the data storage device 102 (or one or more components thereof) to perform operations described herein. Components described herein may be operationally coupled to one another using one or more nodes, one or more buses (e.g., data buses and/or control buses), one or more other structures, or a combination thereof. One or more components described herein may include one or more physical components, such as hardware controllers, state machines, logic circuits, one or more other structures, or a combination thereof, to enable the data storage device 102 to perform one or more operations described herein.

Alternatively or in addition, one or more aspects of the data storage device 102 may be implemented using a microprocessor or microcontroller programmed (e.g., by executing instructions) to perform operations described herein, such as one or more operations of the method 300 of FIG. 3. In a particular embodiment, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM).

It should be appreciated that one or more operations described herein as being performed by the controller 130 may be performed at the memory 104. As an illustrative example, "in-memory" ECC operations may be performed at the memory die 103 alternatively or in addition to performing such operations at the controller 130.

The data storage device 102 may be attached to or embedded within one or more devices, such as within a housing of a host communication device (e.g., the accessing device 170). For example, the data storage device 102 may be integrated within an apparatus such as a mobile telephone, a computer (e.g., a laptop, a tablet, or a notebook computer), a music player, a video player, a gaming device or console, an electronic book reader, a personal digital assistant (PDA), a portable navigation device, or other device that uses internal non-volatile memory. However, in other embodiments, the data storage device 102 may be implemented in a portable device configured to be selectively coupled to one or more external devices, such as the accessing device 170.

To further illustrate, the data storage device 102 may be configured to be coupled to the accessing device 170 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The memory 104 may include a three-dimensional (3D) memory, such as a resistive random access memory (ReRAM), a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), or a combination thereof. Alternatively or in addition, the memory 104 may include another type of memory. In a particular embodiment, the data storage device 102 is indirectly coupled to an accessing device (e.g., the accessing device 170) via a network. For example, the data storage device 102 may be a network-attached storage (NAS) device or a component (e.g., a solid-state drive (SSD) component) of a data center storage system, an enterprise storage system, or a storage area network. The memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the spirit and scope of the disclosure as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus comprising
means for storing information, the means for storing comprising storage elements of a resistance-based memory; and
means for controlling the means for storing, the means for controlling configured to:
store a codeword into a first set of the storage elements, the codeword representing data to be stored and comprising first redundancy information associated with the data;
store auxiliary redundancy information into a second set of the storage elements, the auxiliary redundancy information is associated with the data; and
discard the auxiliary redundancy information from the second set according to a first-in, first-out (FIFO) schedule while retaining the first redundancy information at the first set.

2. The apparatus of claim 1, wherein the means for controlling is further configured to:
read a representation of the codeword from the first set; and
read a representation of the auxiliary redundancy information from the second set.

3. The apparatus of claim 2, wherein the means for controlling is further configured to read the representation of the codeword after waiting a particular time interval after storing the codeword into the first set.

4. The apparatus of claim 2, wherein the means for controlling is further configured to send, in response to an error correction coding (ECC) operation using the representation of the codeword and the representation of the auxiliary redundancy information indicating that the representation of the codeword comprises one or more errors, error correction information to the resistance-based memory.

5. The apparatus of claim 4, wherein the means for controlling is further configured to re-program a subset of the first set based on the error correction information.

6. The apparatus of claim 5, wherein the means for controlling is further configured to discard the auxiliary redundancy information in response to re-programming of the subset.

7. The apparatus of claim 1, wherein the means for controlling is further configured to:
read a representation of the codeword from the first set; and
read a representation of the auxiliary redundancy information from the second set in response to an error correction coding (ECC) operation using the first redundancy information indicating that the representation of the codeword comprises one or more errors.

8. The apparatus of claim 1, wherein the means for controlling is further configured to:
read a representation of the codeword from the first set; and
discard the auxiliary redundancy information in response to decoding the representation of the codeword using the first redundancy information.

9. The apparatus of claim 1, wherein the means for controlling is further configured to set an entry of a table to a first value to indicate that the codeword is associated with the auxiliary redundancy information.

10. The apparatus of claim 9, wherein the means for controlling is further configured to set, in response to discarding the auxiliary redundancy information, the entry to a second value.

11. The apparatus of claim 1, wherein the means for controlling comprises a controller coupled to the resistance-based memory, the controller configured to initiate storing the codeword, storing the auxiliary redundancy information, and discarding the auxiliary redundancy information.

12. The apparatus of claim 1, wherein the resistance-based memory has a three-dimensional (3D) memory configuration that is monolithically formed in one or more physical levels of arrays of memory cells having an active area above a silicon substrate.

13. A device comprising:
a resistance-based memory, the resistance-based memory comprising a first set of storage elements and a first-in, first-out (FIFO) storage device; and
a controller coupled to the resistance-based memory, the controller configured to cause a codeword to be stored into the first set, the codeword representing data to be stored and comprising first redundancy information associated with the data, the controller further configured to cause auxiliary redundancy information associated with the data to be stored into the FIFO storage device, and the controller further configured to cause the auxiliary redundancy information to be discarded from the FIFO storage device while the first redundancy information is retained at the first set.

14. The device of claim 13, wherein the controller is further configured to cause the auxiliary redundancy information to be discarded from the FIFO storage device in response to correcting one or more errors associated with the codeword.

15. A data storage device comprising:
a resistive random access memory (ReRAM), the ReRAM comprising a first storage region; and
a controller coupled to the ReRAM, the controller configured to cause a codeword to be stored into the ReRAM, the codeword representing data to be stored at the first storage region and comprising first parity bits, the controller further configured to cause auxiliary parity bits associated with the data to be stored at a second storage region, and the controller further configured to cause the auxiliary parity bits to be erased from the second storage region after expiration of a time interval that is based on a relaxation effect associated with the ReRAM while the first parity bits are retained at the first storage region.

16. The data storage device of claim 15, wherein the ReRAM comprises a common word line that comprises the first storage region and the second storage region.

17. The data storage device of claim 15, wherein the ReRAM comprises a common block that comprises the first storage region and the second storage region.

18. The data storage device of claim 15, wherein the ReRAM comprises a reserved storage region, and wherein the reserved storage region comprises the second storage region and is dedicated to storing the auxiliary parity bits.

19. The data storage device of claim 15, wherein the controller is further configured to send, in response to an error correction coding (ECC) operation indicating that a representation of the codeword comprises one or more errors, error correction information to the ReRAM.

20. The data storage device of claim 19, wherein the controller is further configured to re-program one or more storage elements of the first storage region based on the error correction information, and wherein the auxiliary parity bits are erased in response to the controller re-programming the one or more storage elements.

21. The data storage device of claim 15, wherein the ReRAM has a three-dimensional (3D) memory configuration that is monolithically formed in one or more physical levels of arrays of memory cells having an active area above a silicon substrate, and further comprising circuitry associated with operation of the memory cells.

22. The data storage device of claim 15, wherein the controller comprises a stability engine configured to initiate re-programming of a subset of storage elements of the first storage region to decrease short-term instability associated with the subset and to decrease sensitivity of the subset to noise.

23. The data storage device of claim 22, wherein the stability engine is further configured to cause the auxiliary parity bits to be discarded in response to re-programming of the subset.

24. The data storage device of claim 15, wherein the second storage region comprises a first-in, first-out (FIFO) storage device having a storage capacity that is based on the relaxation effect.

25. The data storage device of claim 24, wherein the storage capacity is further based on a programming throughput associated with the ReRAM.

26. The apparatus of claim 1, wherein the means for controlling is further configured to:
access stored information that indicates the FIFO schedule to identify that the auxiliary redundancy information has been stored to the resistance-based memory prior to other auxiliary redundancy information, and
discard the auxiliary redundancy information based on the stored information.

* * * * *